(12) United States Patent
Schulze et al.

(10) Patent No.: US 9,735,485 B2
(45) Date of Patent: Aug. 15, 2017

(54) UNIBODY SOCKETS INCLUDING LATCH EXTENSIONS

(71) Applicant: HEWLETT PACKARD ENTERPRISE DEVELOPMENT LP, Houston, TX (US)

(72) Inventors: James Jeffery Schulze, Houston, TX (US); Joseph Allen, Tomball, TX (US); Louis J Lawrence, IV, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/120,122

(22) PCT Filed: Feb. 28, 2014

(86) PCT No.: PCT/US2014/019339
§ 371 (c)(1),
(2) Date: Aug. 18, 2016

(87) PCT Pub. No.: WO2015/130303
PCT Pub. Date: Sep. 3, 2015

(65) Prior Publication Data
US 2017/0069985 A1    Mar. 9, 2017

(51) Int. Cl.
*H01R 13/62* (2006.01)
*H01R 12/70* (2011.01)
(Continued)

(52) U.S. Cl.
CPC ......... *H01R 12/7023* (2013.01); *G06F 1/183* (2013.01); *G06F 1/185* (2013.01);
(Continued)

(58) Field of Classification Search
CPC ...................... H01R 13/6273; H01R 12/7023
(Continued)

(56) References Cited

U.S. PATENT DOCUMENTS

| 3,216,580 | A | * | 11/1965 | Fricker, Jr. ........... H05K 7/1417 211/41.17 |
| 3,767,974 | A |   | 10/1973 | Donovan, Jr. |

(Continued)

FOREIGN PATENT DOCUMENTS

| JP | 2001-126810 A | 5/2001 |
| JP | 2001-196130 A | 7/2001 |

(Continued)

OTHER PUBLICATIONS

Cisco 12000 Series Router Memory Replacement Instructions, Cisco Systems, Inc., 2011, pp. 1-40,<cisco.com/c/en/us/td/docs/routers/12000/12012/maintenance/guide/4338bmem.pdf>.

(Continued)

*Primary Examiner* — Neil Abrams

(57) ABSTRACT

An example device in accordance with an aspect of the present disclosure includes a unibody socket to receive a memory module that is to interface with a computing system. A portion of the unibody socket extends into a latch extension. The latch extension is to retain the memory module based on a positive locking latch retention force that is to increase in response to an unseating force of the memory module, to prevent removal of the memory module while the latch extension is in a latched position.

15 Claims, 7 Drawing Sheets

(51) Int. Cl.
*G06F 1/18* (2006.01)
*H05K 7/14* (2006.01)
*H01R 12/72* (2011.01)

(52) U.S. Cl.
CPC ....... *H01R 12/7029* (2013.01); *H01R 12/721* (2013.01); *H05K 7/1405* (2013.01)

(58) Field of Classification Search
USPC .......................................... 439/328, 357, 358
See application file for complete search history.

(56) References Cited

U.S. PATENT DOCUMENTS

| | | | |
|---|---|---|---|
| 4,712,848 A * | 12/1987 | Edgley ............... | H01R 12/7005 439/327 |
| 4,781,612 A * | 11/1988 | Thrush ................. | H01R 12/716 439/328 |
| 5,074,800 A | 12/1991 | Sasao et al. | |
| 5,112,242 A * | 5/1992 | Choy .................. | H01R 12/7005 439/326 |
| 5,211,571 A * | 5/1993 | Arai .................... | H01R 12/7005 439/325 |
| 5,267,872 A | 12/1993 | Gou et al. | |
| 5,634,803 A | 6/1997 | Cheng et al. | |
| 5,637,004 A | 6/1997 | Chen et al. | |
| 5,689,405 A * | 11/1997 | Bethurum ............ | H05K 5/0269 361/737 |
| 5,726,865 A | 3/1998 | Webb et al. | |
| 5,921,808 A * | 7/1999 | Haftmann .......... | H01R 12/7023 439/358 |
| 5,938,467 A * | 8/1999 | Savage, Jr. ........ | H01R 13/6272 439/358 |
| 5,941,723 A | 8/1999 | Yu | |
| 5,944,549 A | 8/1999 | Po et al. | |
| 5,980,282 A | 11/1999 | Cheng | |
| 6,045,386 A | 4/2000 | Boe | |
| 6,111,747 A | 8/2000 | Jeffries et al. | |
| 6,129,572 A * | 10/2000 | Feldman ............... | G06K 13/085 439/325 |
| 6,390,837 B1 | 5/2002 | Lee | |
| 6,409,533 B1 * | 6/2002 | Savage, Jr. ........ | H01R 12/7005 439/358 |
| 6,855,009 B2 | 2/2005 | Nishiyama | |
| 7,004,773 B1 | 2/2006 | Poh et al. | |
| 7,578,689 B2 | 8/2009 | Guan et al. | |
| 8,052,450 B2 | 11/2011 | Li et al. | |
| 8,087,950 B1 | 1/2012 | Deng et al. | |
| 9,620,895 B2 * | 4/2017 | Hastings ............ | H01R 13/6275 |
| 2009/0035979 A1 | 2/2009 | Kerrigan et al. | |
| 2009/0077293 A1 | 3/2009 | Kerrigan et al. | |
| 2011/0045681 A1 | 2/2011 | Tsai | |
| 2011/0159718 A1 | 6/2011 | McKee | |
| 2012/0064749 A1 | 3/2012 | Hashimoto | |

FOREIGN PATENT DOCUMENTS

| | | |
|---|---|---|
| JP | 2006-202615 A | 8/2006 |
| KR | 2011-0003816 A | 1/2011 |
| KR | 101089120 | 12/2011 |

OTHER PUBLICATIONS

PCT/ISA/KR, International Search Report, dated Nov. 25, 2014, PCT/US2014/019339, 11pps.
"Removing and Replacing Parts: Dell PowerEdge 1300 Systems Service Manual," Retrieved Internet Sep. 6, 2012 <http://support.dell.com/support/edocs/systems/sgeck/sm/remove.htm>.
Office Action dated Jul. 25, 2016, U.S. Appl. No. 14/761,339, 11 pages.
PCT/ISA/KR, International Search Report, dated Oct. 18, 2013, PCT/US2013/022724, 10 pps.
PCTUS2013022724, filed Jan. 23, 2013.

\* cited by examiner

UNIBODY SOCKETS INCLUDING LATCH EXTENSIONS

BACKGROUND

A computing system may receive a memory module at a socket that has independent latches that are pivotably attached to the socket. The latches impose manufacturing and assembly costs, and are associated with computing system instability as a result of self-opening operation, which may allow unseating of the memory module.

BRIEF DESCRIPTION OF THE DRAWINGS/FIGURES

DETAILED DESCRIPTION

Example sockets provided herein are based on a single-member unibody frame, and do not need separately assembled latches. The example unibody sockets include latch extensions that avoid the self-opening aspect of existing pivoting latch-and-socket assemblies, whose memory retention characteristics are based on a friction fit. Accordingly, example unibody sockets prevent a tendency for a component (e.g., memory module) interfaced with the unibody socket to become unseated under a shock and vibe loading or other conditions.

In an example, a unibody socket extends to form latching and retention mechanisms that are integrated from the parent material (e.g., a polymer such as molded plastic) of the unibody socket. Extensions of the unibody socket may be formed as spring loaded "arm" features that may snap to hold a memory module or other component in place. The unibody socket enables a reduction of the total number of parts in a system, reducing time, difficulty, and/or costs of tooling and assembly. Furthermore, examples of the unibody socket do not need pivots/detents/snaps to retain a pivoting latch arm in place, because latching features are part of the main body of the socket and may use natural properties of the unibody socket to serve as a spring/biasing feature to secure the memory module locked into place. Furthermore, geometric arrangement of the latch extensions and their interaction with the memory module provides a positive latching torque to avoid releasing the memory module in response to an unseating force.

Figure 1:
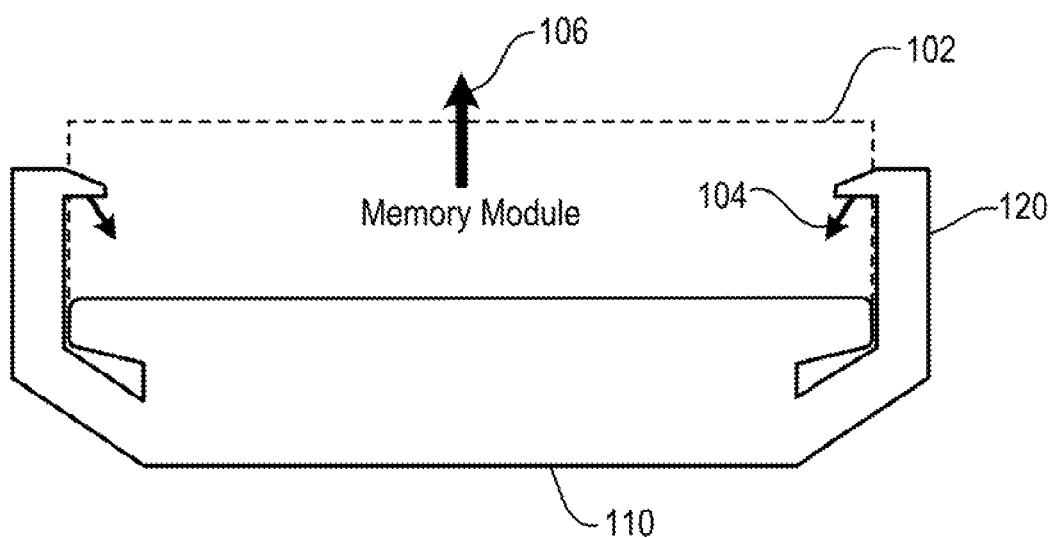
FIG. 1 is a diagram of a unibody socket including latch extensions according to an example.

FIG. 1 is a diagram of a unibody socket 110 including latch extensions 120 according to an example. A system 100 may receive a component (e.g., memory module 102) at the unibody socket 110. The latch extension 120 may retain the memory module 102, by generating latch retention force 104 in response to the unseating force 106.

The unibody socket 110, including latch extensions 120, are formed of a material (such as a polymer) having elastic properties, enabling a spring tension in the latch extensions 120. In an example, the material may be a type of plastic, including a blend such as Polycarbonate/Acrylonitrile Butadiene Styrene (PC/ABS). The latching ability of the unibody socket 110 and latching extensions 120 can take advantage of the natural elastic spring-like properties of the unibody socket 110 for a more positive-locking technique of retaining components in the unibody socket 110. The latch extensions 120 may extend from the main body of the unibody socket 110 at a region positioned inside of the area where the latch retention force 104 is applied to the memory module 106, to generate the positive locking latch retention forces 104. Accordingly, the geometric arrangement of the latch extensions 120 enables the latch retention forces 104 to increase in response to the unseating force 106.

The latch extensions 120 are illustrated as extending from the unibody socket 110 at an angle. In alternate examples, the latch extensions 120 may extend horizontally, diagonally (upward or downward), linearly, curved (upward or downward), or may extend in irregular patterns (e.g., elbow-shaped) from the main body of the unibody socket 110. The latch extensions 120 may allow for clearance around edges of the unibody socket 110, to enable the latch extensions 120 to deflect to accommodate the memory module 102 (for insertion, retention, and/or removal) and remain within a desired footprint. The flexing latch extension 120 is shown extending around an outside of the main body of the unibody socket 110. In alternate examples, at least a portion of the latch extension 120 may pass over or through the main body of the unibody socket 110. For example, the latch extension 120 may include a cavity/cutout that may pass over a portion of the unibody socket 110 to accommodate movement of the latch extension 120, or vice versa. The unibody socket 110 may be dimensioned to allow side-by-side placement of multiple unibody sockets 110 according to a compact lateral footprint. For example, a thickness of latch extensions 120 may be decreased compared to the illustrated thickness, to accommodate compact placement of unibody sockets 110 side-by-side.

A memory module 102 is illustrated in FIG. 1. In alternate examples, the unibody socket 110 may accommodate other components, such as an allocated land over motherboard (ALOM), riser card, daughtercard, or other add-on component installable into a system board to expand functionality.

The example unibody sockets 110 are usable in various systems, including storage and/or server products and personal computing devices using various types of memory and memory standards. Unibody socket 110 may accept single in-line memory modules (SIMMs), dual in-line memory modules (DIMMs), and others. Memory module 102 may be compatible with Joint Electron Devices Engineering Council (JEDEC) Solid State Technology Association's JESD79-3E document defining support for memory modules such as various dynamic random access memory (DRAM) modules Including double data rate (DDRx), where x is an integer indicating memory variation (e.g., DDR2, DDR3, DDR4, and so on). However, system 100 may be compliant with other memory standards and modules, including synchronous, asynchronous, graphics, and other types of memory modules that interface with unibody socket 110.

Thus, examples of unibody socket 110 are integrated with latch extensions 120 extending from either side of the unibody socket 110, without a need for multiple tooling, manufacturing, and assembly of separate components. The latch extensions 120 are arranged to generate positive latch retention forces 104 in response to applied loads (such as unseating force 106). The latch extensions 120 provide spring loaded snap-to operation, to hold the memory module 106 in place based on a geometric arrangement that does not rely solely on a friction-based grip.

Figure 2:
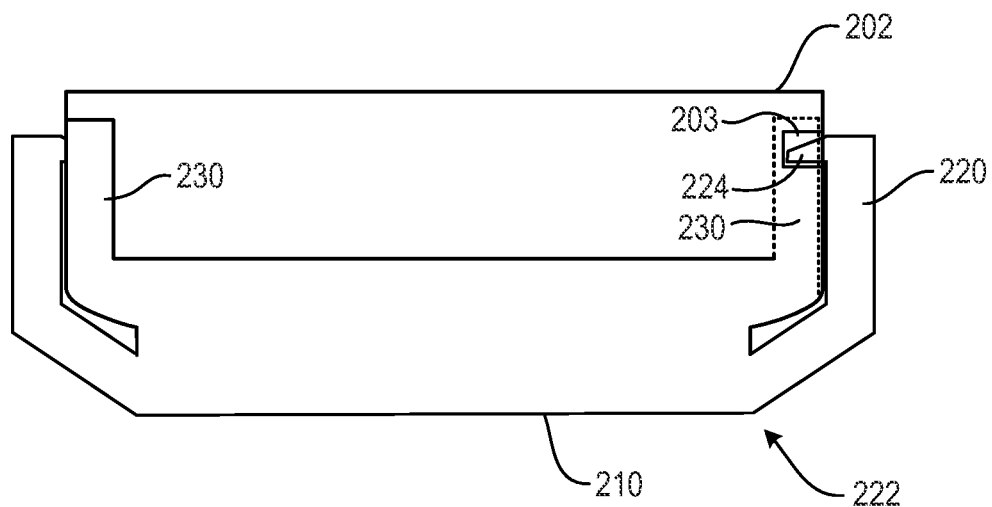
FIG. 2 is a diagram of a unibody socket including latch extensions according to an example.

FIG. 2 is a diagram of a unibody socket 210 including latch extensions 220 according to an example. System 200 may receive memory module 202 at the unibody socket 210. The latch extension 220 may retain the memory module 202 based on contact region 224 of the latch extension 220 interacting with cutout 203 of the memory module 202. The latch extensions 220 are flexible, e.g., based on a flex region 222 of the unibody socket 210. The unibody socket 210 also includes guide extensions 230, which are to stabilize the memory module 202.

The latch extensions 220 may flex about the flex region 222. The flex region 222 is generally located toward a base of the latch extension 220, and the latch extension 220 also may be flexible along its entire length. A general location of the flex region 222 may be provided based on a geometry of the latch extension 220 relative to a main body of the unibody socket 210. For example, a socket cutout may separate the latch extension 220 from the guide extension 230, the socket cutout extending from an edge of the unibody socket 210 inward (diagonally inward and downward as illustrated in FIG. 2), positioning the flex region 222 generally toward the base of the latch extension 220. In alternate examples, the latch extension 220 may include a necked-down portion to selectively affect flexibility and locate the flex region 222 at a desirable location. A desirable location is associated with enabling the latch extension 220 to generate a positive locking latch retention force in response to an unseating force. In an example, the flex region 222 is positioned at an inward offset from an edge of the unibody socket 210.

The guide extensions 230 are to stabilize the memory module 202, during insertion, retention, removal, and other situations. A guide extension 230 may extend vertically, generally at an edge of the unibody socket 210 as illustrated. In alternate examples, the guide extensions 230 may extend diagonally, linearly, curved, or may extend in irregular patterns (e.g., elbow-shaped) from the main body of the unibody socket 210. The guide extensions 230 may be flexible (e.g., less flexible than the latch extensions 220), rigid, and/or otherwise fixed in place (e.g., buttressed, tensioned, or otherwise stabilized by additional support extensions of the unibody socket 210). The guide extensions 230 may extend from locations along the unibody socket 210 other than the edges as illustrated, such as at an intermediate point or midpoint. The location of the guide extensions 230 also may be based on characteristics of the memory module 202 being inserted. In an example using a DDRx memory module 202, the guide extensions 230 may be placed at the ends of the unibody socket 210 to avoid interfering with electrical components of the DDRx memory module 202. An insertable component (such as a card or memory module) to be used with the unibody socket 210 may be associated with "keep-out zones" designated by the component's printed circuit board (PCB) design. Accordingly, location and placement/extension of the guide extensions 230 may be adjusted accordingly, to accommodate keep-out zones or other similar design specifications of the insertable component.

The guide extensions 230 (and latch extensions 220) may extend upward from the unibody socket 210 to variable heights, such as a height corresponding to the intended memory module 202 or other component. A full-height dual inline memory module (DIMM) is shown, corresponding to the illustrated height of the guide extensions 230 and latch extensions 220. The various extensions may be shorter (e.g., for a half-height memory module), or taller (e.g., for a riser card) than the illustrated heights.

The guide extension 230 is shown having a curved elbow portion on an outside of its base, and a linear elbow portion on an inside of the guide extension 230. The curved outside portion of the guide extension 230 may facilitate interaction with the linear inside elbow portion of the latch extension 220. For example, the linear elbow portion of the latch extension 220 may smoothly slide against the curved outside portion of the guide extension 230, without causing binding in the flexing of the latch extension 220. Surfaces of the guide extensions 230 and/or the latch extensions 220 may be hollowed or include a cutout, to accommodate movements relative to each other. In alternate examples, surfaces of the guide extensions 230 (and latch extensions 220) may assume other contours and/or shapes to provide desired reinforcement/rigidity and/or desired flexibility/operation.

The latch extension 220 includes a contact region 224, to make contact with the memory module 202 at cutout 203. The contact region 224 may be angled to for insertion of the memory module 202, to deflect the latch extension 220 to receive the memory module 202. The latch extension 220 enables the contact region 224 to provide a positive locking latch retention force to the memory module 202 at the cutout 203. The latch extension 220 and/or the contact region 224 may apply the retention force(s) to upper surfaces of the memory module cutouts 203, as well as to side (e.g., outer) surfaces of the memory module 202 and/or cutouts 203. Accordingly, a degree of horizontal extension of the contact region 224 may be chosen to correspond to a depth of the cutout 203 of the particular type of insertable component (e.g., memory module 202). In an example, the contact region 224 is elongated to contact the side surface of the cutout 203 and bottom-out, to prevent other surfaces of the latch extension 220 from contacting a side of the memory module 202. In an alternate example, the contact region 224 may be sized to enable simultaneous contact between the contact region 224 and the vertical and horizontal edges of the cutout 203, as well as enable contact between the vertical edge of the latch extension 220 and the vertical edge of the memory module 202.

Figure 3:
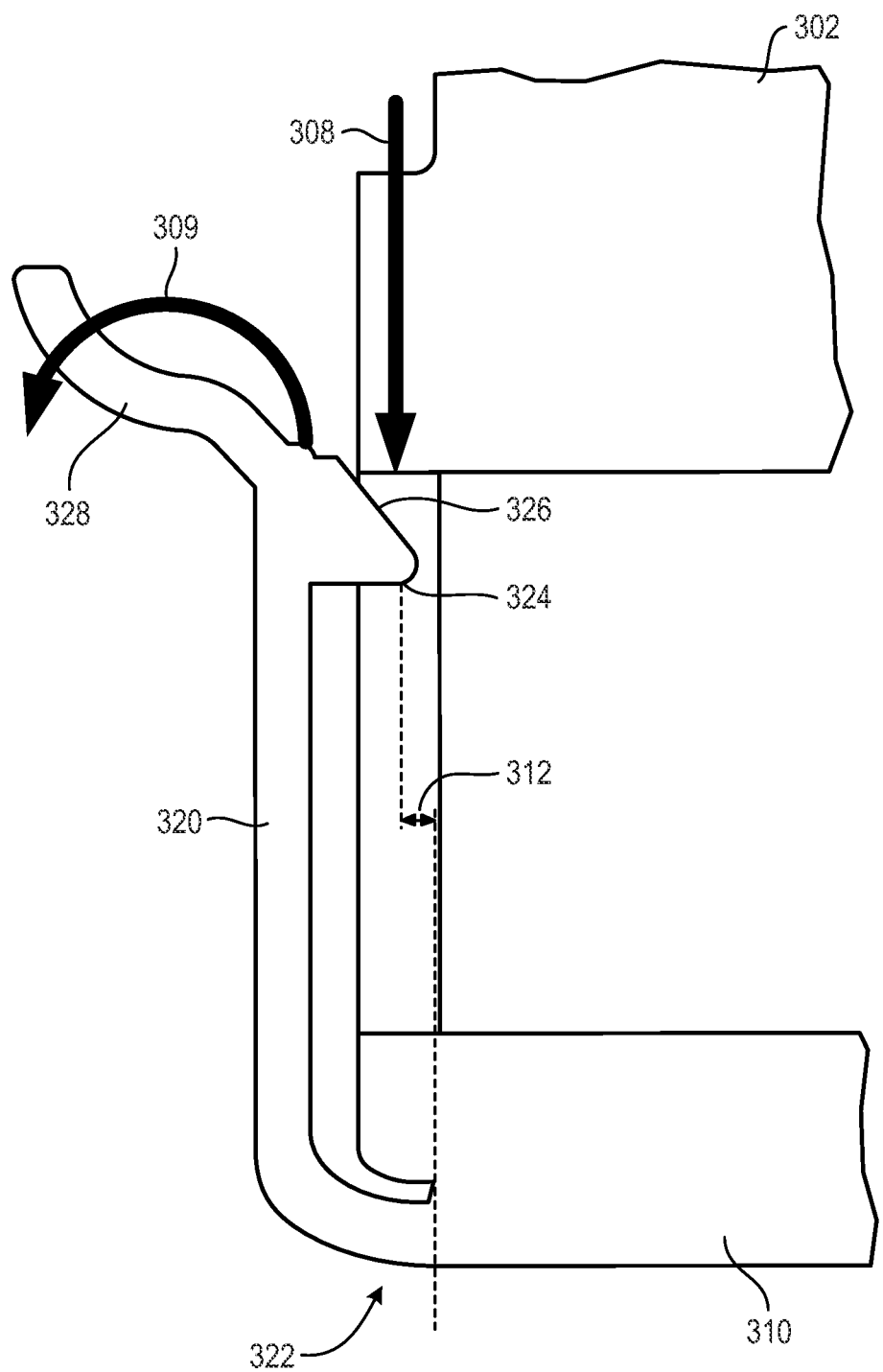
FIG. 3 is a diagram of a unibody socket including a latch extension receiving a memory module according to an example.

FIG. 3 is a diagram of a unibody socket 310 including a latch extension 320 receiving a memory module 302 according to an example. The latch extension 320 includes a flex region 322, grip region 328, contact region 324, and latch lead-in 326. Offset 312 indicates a separation between a location of the flex region 322 relative to the contact region 324. Installation force 308 causes the memory module 302 to contact the latch lead-in 326 and introduce a flex force 309 to the latch extension 320, deflecting the latch extension 320 about the flex region 322, from the Illustrated latched position toward an unlatched position (in which the contact region 324 moves back to allow the memory module 302 to be inserted).

The contact region 324 of the latch extension 320 includes a ramped latch lead-in 326 to facilitate insertion of the memory module 302. A leading edge of the contact region 324 is rounded, to facilitate insertion and/or removal of the memory module 302. In alternate examples, the edge of the contact region 324 may be a sharp angle, including a squared 90 degree angle or other shapes. In an example, the leading edge of the contact region 324 may be contoured to correspond to a cutout of the memory module 302 or other intended component to be retained by the unibody socket 310. For example, a cutout of the memory module 302 is shown having rounded inside corners, corresponding to a rounded nose of the contact region 324.

The memory module 302 is shown being inserted straight down into the unibody socket 310, according to installation force 308. Upon contact between an edge of the memory module 302 and the latch lead-in 326, the ramped latch lead-in drives the flexible spring-loaded latch extension 320 to open outward, enabling the memory module 302 to be seated and retained in the unibody socket 310. To remove the memory module 302, the latch extension 320 may be moved outward and away from the memory module 302 using the grip region 328, enabling the memory module 302 to be pulled up and out of the unibody socket 310.

The offset 312 is indicated, showing a difference in a location of the contact region 324 of the latch extension 320, and a location of the flex region 322 of the latch extension 320. In an example, the flex region 322 may be defined, at least in part, by a cutout that extends into the main body of the unibody socket between the latch extension 320 and guide extension. The offset 312 is associated with the flex region 322 being positioned inward relative to the latch contact region 324 of the latch extension 320.

Figure 4:
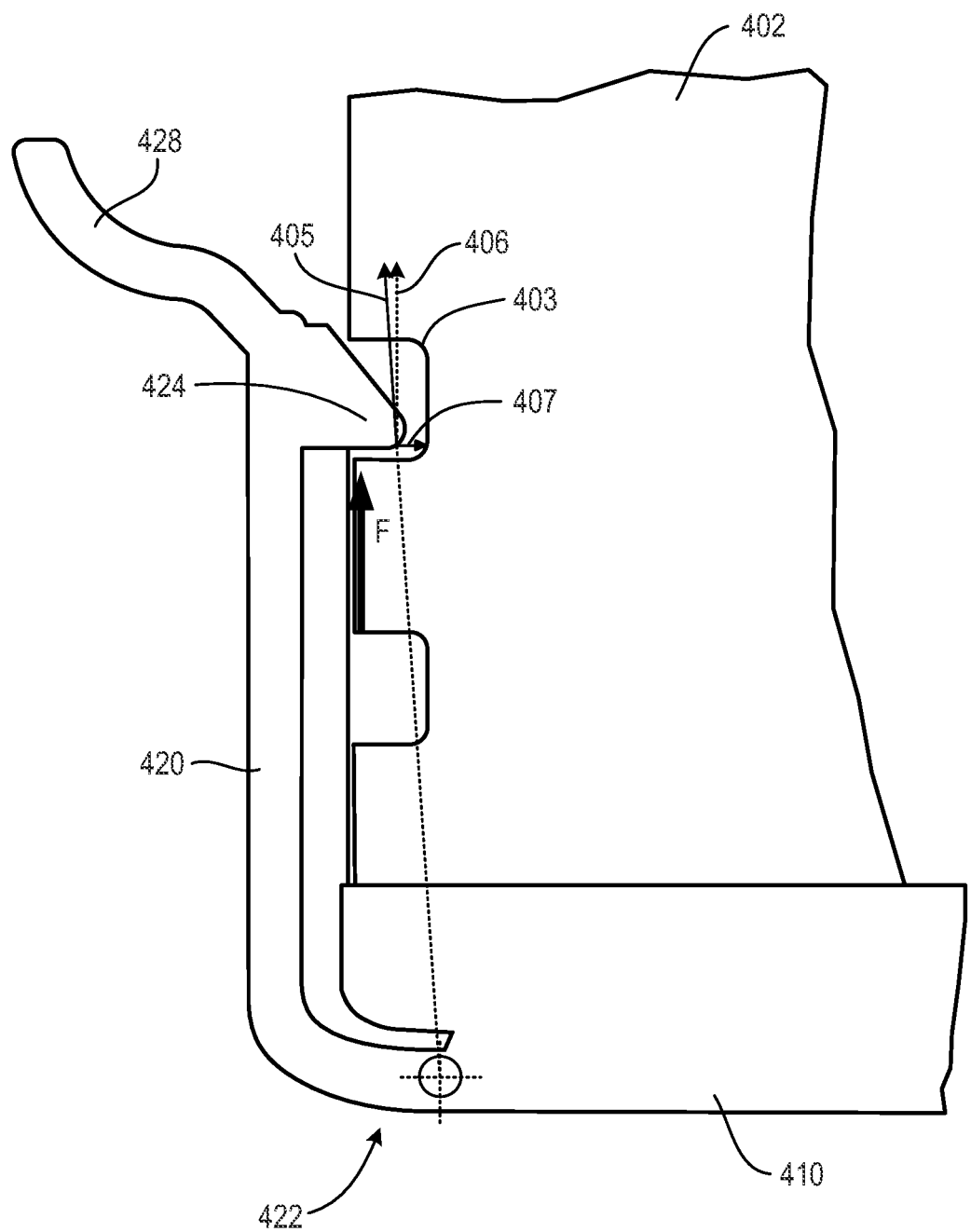
FIG. 4 is a diagram of a unibody socket including a latch extension retaining a memory module according to an example.

FIG. 4 is a diagram of a unibody socket 410 including a latch extension 420 retaining a memory module 402 according to an example. The latch extension 420 includes flex region 422, grip region 428, and contact region 424. The latch extension 420 is to resist an unseating force 406, caused by contact between the cutout 403 of memory module 402 and the contact region 424 of the latch extension 420. The unseating force 406 is resolvable to first component vector 405 and second component vector 407, based at least in part on the orientation of the flex region 422 relative to the contact region 424. Accordingly, the latch extension 420 may remain in the illustrated latched position in response to the unseating force 406, without being deflected toward an unlatched position away from the memory module 402. The grip region 428 may be used to manually deflect the latch extension 420 to the unlatched position to remove the memory module 402 from the unibody socket 410.

Unseating force 406 is shown acting vertically on the contact region 424 of the latch extension 420. The arrangement and features of the latch extension 420, contact region 424, and flex region 422 enable the unseating force 406 to be resolved into a first component vector 405 and a second component vector 407. The first component vector 407 extends along an axis between the contact region 424 and the flex region 422. The flex region 422 is shown as a precise crosshair intersection for convenience in establishing the extension of the first component vector. However, the flex region 422 may include a more generalized region of the latch extension 420 (and or a portion of the main body of the unibody socket 410). The latch extension 420 may withstand the first component vector 405 based on a structural/material strength to maintain physical integrity of a shape of the latch extension 420, e.g., preventing the contact region 424 from failing/yielding independent of movement of the latch extension 420. The second component vector 407 extends along an axis perpendicular to the first component vector 405, away from the latch extension 420 and toward the memory module 402. Thus, the second component vector 407 contributes to a positive locking latch retention force, ensuring that the latch extension 420 remains in a latched position in response to the unseating force 406. The first component vector 405 and the second component vector 407 may be affected by the offset between the contact region 424 and the flex region 422 (e.g., see offset 312 in FIG. 3).

Thus, example latches described herein may locate the flex region 422 to induce a positive latch retention force when the memory module 402 is experiencing unseating force 406, including during shock and vibration. The positive latch retention force may result from the flex region 422 being located more inward towards the memory module 402 than the contact region 424, e.g., where interaction occurs between the latch extension 420 and cutout 403 of the memory module 402. The vectors 405, 406, 407 are illustrated at a front edge of the contact region 424. However, the analysis applies for other points of contact with the memory module 402 along the contact region 424. As a larger unseating force 406 is applied, the positive locking latch retention force 407 increases.

Figure 5A:
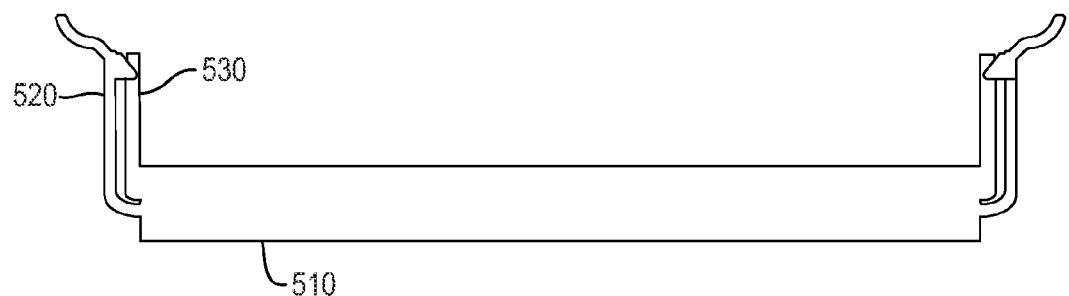
FIG. 5A is a diagram of a unibody socket including latch extensions and guide extensions according to an example.

FIG. 5A is a diagram of a unibody socket 510 including latch extensions 520 and guide extensions 530 according to an example. The guide extensions 530 are illustrated behind the latch extensions 520, to reveal details of the contact region of the latch extension 520. In alternate examples, the guide extensions 530 may be placed in front of and/or behind the latch extensions 520. The guide extensions 530 may have various heights compared to the latch extensions 520, but are illustrated as generally equal.

Figure 5B:
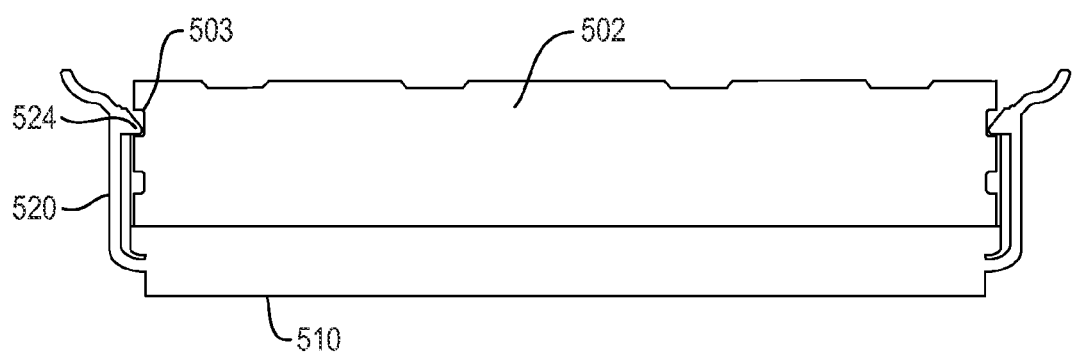
FIG. 5B is a diagram of a unibody socket including latch extensions retaining a memory module according to an example.

FIG. 5B is a diagram of a unibody socket 510 including latch extensions 520 retaining a memory module 502 according to an example. The latch extension 520 is to retain cutouts 503 of the memory module 502 based on contact regions 524 of the latch extensions 520. The memory module 502 is engaged by the latch extensions 520 and stabilized by the guide extensions, to resist unseating and other forces and ensuring stable operation of the memory module 502. Additional guide extensions may be used, but are omitted from FIG. 5B for better visibility of the memory module 502, contact regions 524, and cutouts 503.

Figure 6:
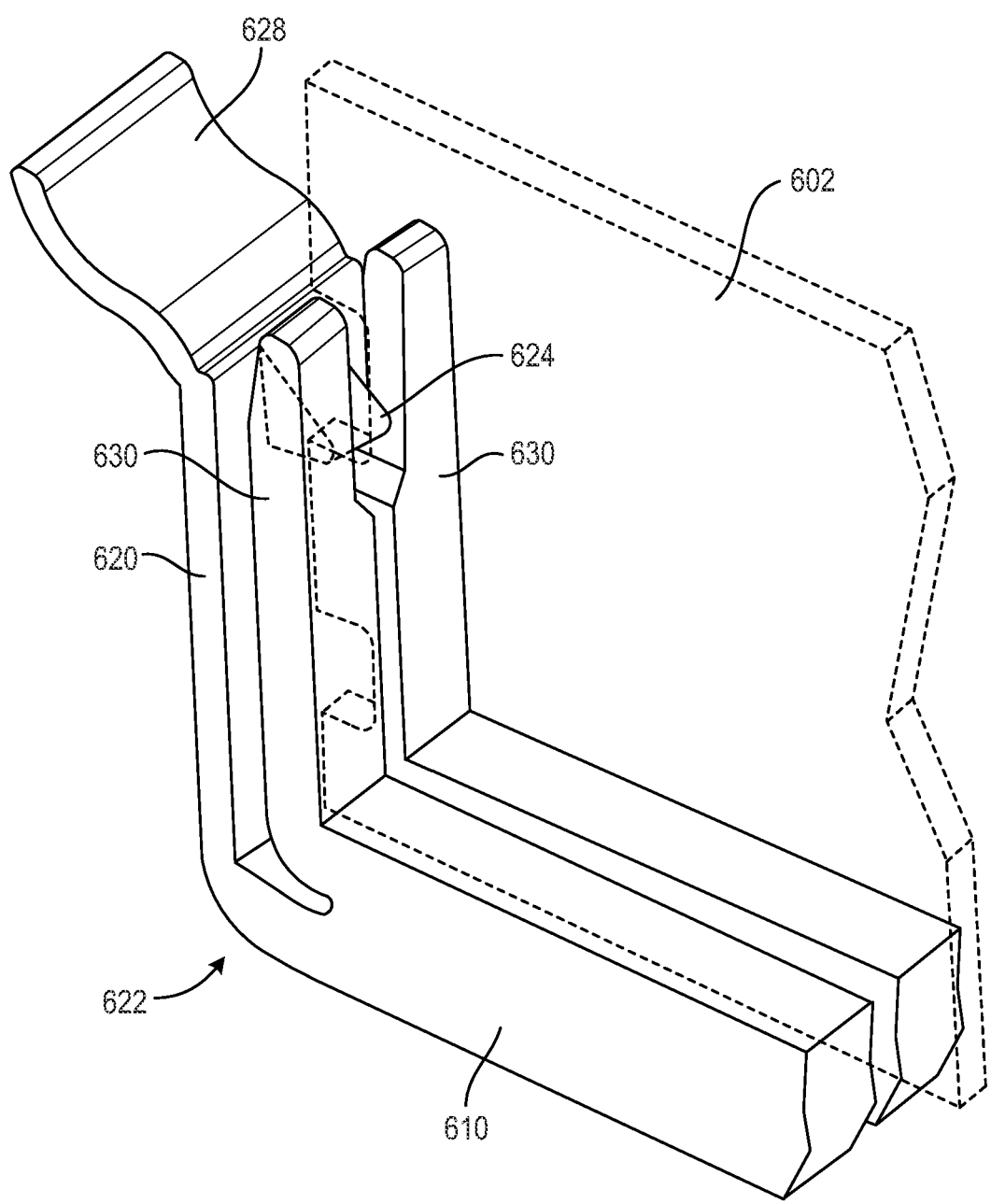
FIG. 6 is a perspective view of a unibody socket including a latch extension and guide extensions according to an example.

FIG. 6 is a perspective view of a unibody socket 610 including a latch extension 620 and guide extensions 630 according to an example. The latch extension 620 may retain the memory module 602 based on contact region 624 of the latch extension. The latch extension 620 is flexible, e.g., based on a flex region 622 of the unibody socket 610, and may be manipulated manually based on grip region 628. The unibody socket 610 also includes guide extensions 630, to stabilize the memory module 602. Guide extensions 630 may include guide extension lead-ins to contact the memory module 602 and facilitate insertion alignment.

Upper portions of the guide extensions 630 are spaced farther apart than lower portions of the guide extensions 630. The increased spacing allows for the contact region 624 to extend between the guide extensions 630. A ramped lead-in of the guide extensions 630 connects the different spacing along the guide extensions 630, and smoothly guides the memory module 602 into proper vertical alignment with the narrower opening between the lower portions of the guide extensions 630. FIG. 6 also Illustrates an example of the flex region 622 extending horizontally from the main body of the unibody socket 610. The grip region 628 is shown having a wide area for a comfortable and sure grip.

Figure 7:
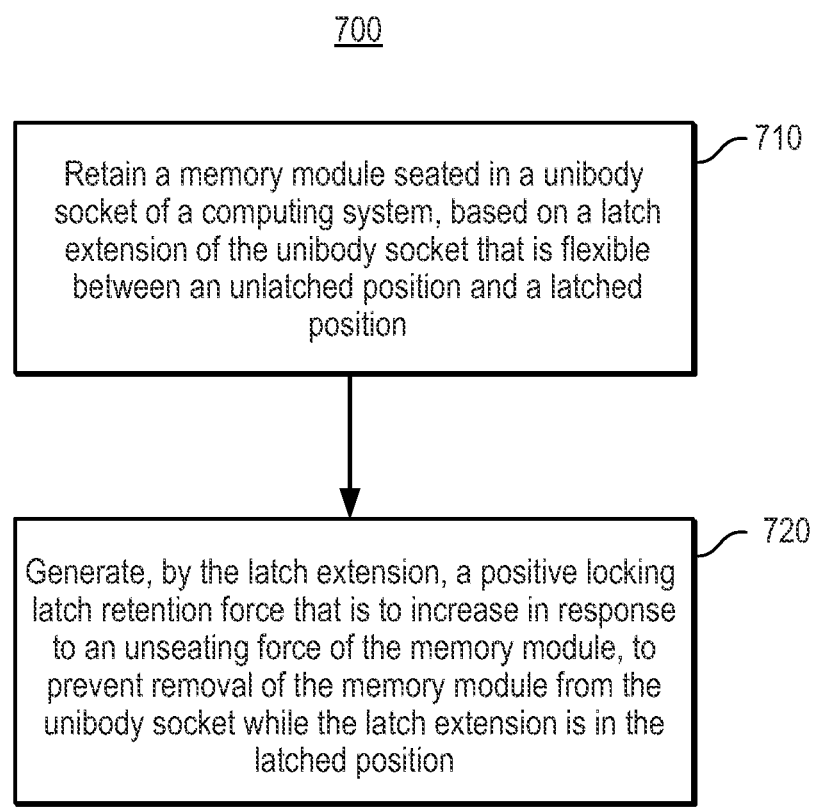
FIG. 7 is a flow chart based on retaining a memory module according to an example.

Referring to FIG. 7, a flow diagram is illustrated in accordance with various examples of the present disclosure.

The flow diagram represents processes that may be utilized in conjunction with various systems and devices as discussed with reference to the preceding figures. While illustrated in a particular order, the disclosure is not intended to be so limited. Rather, it is expressly contemplated that various processes may occur in different orders and/or simultaneously with other processes than those illustrated.

FIG. 7 is a flow chart 700 based on retaining a memory module according to an example. In block 710, a memory module seated in a unibody socket of a computing system is retained based on a latch extension of the unibody socket that is flexible between an unlatched position and a latched position. For example, the latch extension may include a flex region that is offset inward from a contact region of the latch extension. In block 720, the latch extension is to generate a positive locking latch retention force that is to increase in response to an unseating force of the memory module, to prevent removal of the memory module from the unibody socket while the latch extension is in the latched position. For example, the offset of the flex region relative to the contact region enables the latch extension to generate the positive locking latch retention force based on component vectors that increase along with an increase in the unseating force, preventing the latch extensions from being forced open.

What is claimed is:

1. A device comprising:
   a unibody socket to receive a memory module that is to interface with a computing system, wherein a portion of the unibody socket extends into a latch extension;
   wherein the latch extension is to retain the memory module based on a positive locking latch retention force that is to increase in response to an unseating force of the memory module, to prevent removal of the memory module while the latch extension is in a latched position; and
   wherein a flex region of the latch extension provides a flexing axis underneath the memory module about which the latch extension flexes to urge inward a tip of the latch extension.

2. The device of claim 1, wherein the latch extension is to provide the latch retention force based on a positive latching torque acting about the flex region of the latch extension.

3. The device of claim 2, wherein the latch extension includes a contact region to provide the latch retention force to the memory module; and
   wherein the flex region is offset from the contact region to provide the positive latching torque.

4. The device of claim 3, wherein the latch retention force is resolvable to a first component vector, along an axis between the contact region and the flex region, and a second component vector perpendicular to the first component vector and extending away from the latch extension.

5. The device of claim 2, wherein the flex region is based on a region of the latch extension that emerges from the unibody socket.

6. The device of claim 5, wherein the flex region is curved.

7. The device of claim 1, wherein the latch extension includes a latch lead-in that is to cause the latch extension to deflect from the latched position to an unlatched position in response to receiving the memory module.

8. The device of claim 1, wherein the latch extension includes a grip region to facilitate flexing of the latch extension about a flex region of the latch extension.

9. The device of claim 1, wherein the unibody socket includes a guide extension extending from the unibody socket to stabilize insertion of the memory module into the unibody socket.

10. The device of claim 9, wherein the guide extension includes a guide extension lead-in to guide the memory module into insertion alignment with the unibody socket.

11. A computing system comprising:
    a unibody socket to receive a memory module that is to interface with a computing system, wherein a first portion of the unibody socket extends into a latch extension, and a second portion of the unibody socket extends into a guide extension;
    wherein the guide extension is to stabilize insertion of the memory module;
    wherein the latch extension of the unibody socket is to retain the memory module based on a positive locking latch retention force that is to increase in response to an unseating force of the memory module, to prevent removal of the memory module while the latch extension is in a latched position; and
    wherein a flex region of the latch extension provides a flexing axis underneath the memory module about which the latch extension flexes to urge inward a tip of the latch extension.

12. The computing system of claim 11, wherein the unibody socket is to interface with a dual in-line memory module (DIMM).

13. The computing system of claim 11, wherein the unibody socket is to interface with a low-profile memory module.

14. A method, comprising:
    retaining a memory module seated in a unibody socket of a computing system, based on a latch extension of the unibody socket that is flexible between an unlatched position and a latched position; and
    generating, by the latch extension, a positive locking latch retention force that is to increase in response to an unseating force of the memory module, to prevent removal of the memory module from the unibody socket while the latch extension is in the latched position;
    wherein a flex region of the latch extension provides a flexing axis underneath the memory module about which the latch extension flexes to urge inward a tip of the latch extension.

15. The method of claim 14, further comprising applying the latch retention force to the memory module based on a contact region of the latch extension; and
    applying, toward the unibody socket, a positive latching torque about the flex region of the latch extension, based on the flex region being offset from the contact region.

* * * * *